United States Patent
Wu et al.

(10) Patent No.: US 9,441,115 B2
(45) Date of Patent: Sep. 13, 2016

(54) AQUEOUS PHASE PORE SEALING AGENT IMROVING PCB COATING OXIDATION-RESISTANT AND CORROSION-RESISTANT PROPERTIES AND METHOD FOR USING SAME

(75) Inventors: Xiaoming Wu, Guangdong (CN); Yong Lu, Guangdong (CN); Hong Liu, Guangdong (CN); Yinfeng Wu, Guangdong (CN); Qianyuan Liu, Guangdong (CN)

(73) Assignee: TANTZ ENVIRONMENTAL TECHNOLOGIES LTD., Guangdong (CN)

( * ) Notice: Subject to any disclaimer, the term of this patent is extended or adjusted under 35 U.S.C. 154(b) by 134 days.

(21) Appl. No.: 14/358,026

(22) PCT Filed: Nov. 14, 2011

(86) PCT No.: PCT/CN2011/082156
§ 371 (c)(1),
(2), (4) Date: Jun. 12, 2014

(87) PCT Pub. No.: WO2013/071475
PCT Pub. Date: May 23, 2013

(65) Prior Publication Data
US 2014/0314967 A1  Oct. 23, 2014

(51) Int. Cl.
*C09D 5/08* (2006.01)
*C23C 22/60* (2006.01)
*C23C 22/68* (2006.01)
*H05K 3/28* (2006.01)

(52) U.S. Cl.
CPC .............. *C09D 5/086* (2013.01); *C23C 22/60* (2013.01); *C23C 22/68* (2013.01); *H05K 3/282* (2013.01); *H05K 2203/0786* (2013.01); *H05K 2203/0793* (2013.01)

(58) Field of Classification Search
CPC ....... C23C 22/60; C23C 22/68; C09D 5/086; H05K 3/282; H05K 2203/0786; H05K 2203/0793
See application file for complete search history.

(56) References Cited

U.S. PATENT DOCUMENTS

| 5,348,590 A | 9/1994 | Shigemura et al. | |
|---|---|---|---|
| 5,650,088 A | 7/1997 | Kodama | |
| 2012/0021963 A1* | 1/2012 | Kneipp | C23G 1/24 510/259 |
| 2013/0264515 A1* | 10/2013 | Chen | C09G 1/02 252/79.1 |
| 2014/0249065 A1* | 9/2014 | Hsu | C11D 3/0073 510/176 |

FOREIGN PATENT DOCUMENTS

| CN | 1391618 A | 1/2003 |
|---|---|---|
| CN | 101440332 A | 5/2009 |
| CN | 101868125 A | 10/2010 |
| CN | 101925553 A | 12/2010 |
| JP | 63-224728 A | 9/1988 |
| JP | 6-17004 A | 1/1994 |
| JP | 8-277480 A | 10/1996 |
| JP | 2002-97584 A | 4/2002 |
| JP | 2003-213463 A | 7/2003 |
| JP | 2006-63662 A | 3/2006 |

OTHER PUBLICATIONS

Derwent-Acc-No. 2010-J54091, abstract of Chinese Patent Specification No. CN 101750914 A (Jun. 2010).*
Derwent-Acc-No. 2011-P26024, abstract of Chinese Patent Specification No. CN 102212412 A (Oct. 2011).*
Derwent-Acc-No. 2012-M26466, abstract of Chinese Patent Specification No. CN 102559354 A (Jul. 2012).*
Derwent-Acc-No. 2012-N61551, abstract of Chinese Patent Specification No. CN 102605645 A (Jul. 2012).*
Derwent-Acc-No. 2012-R29403, abstract of Chinese Patent Specification No. CN 102660752 A (Sep. 2012).*
Zhang, Tao et al., "Discussion on Corrosion-Resistance of Gold Fingers," Printed Circuit Information, Nov. 2009, No. 11, pp. 45-50.

* cited by examiner

*Primary Examiner* — Anthony J Green
(74) *Attorney, Agent, or Firm* — Muncy, Geissler, Olds & Lowe, P.C.

(57) ABSTRACT

The present invention relates to a water-based pore sealing agent enhancing PCB coating anti-oxidation and anti-corrosion properties, consisting of, by weight, 4-12 parts of a corrosion inhibitor, 15-25 parts of a mixed surfactants system, 10-20 parts of an ion chelating agent, 6-15 parts of a pH regulator, 20-40 parts of a builder, and the rest being purified water. When used to perform pore sealing on a PCB, the water-based pore sealing agent is diluted with purified water first to be diluted 10-100 times, preferably, 100/8-100/3 times. The pH value is 7-11, and is preferably 7.5-9.5. The surface tension is 18-28 dyn/cm. The pore sealing treatment uses a immersion process, and preferably ultrasonic waves are added at the same time to assist in cleaning the pores. For the pore sealing treatment, the temperature is 20-60° C., and the time is 60-150 seconds. After pore sealing, the temperature for drying the coated piece is 80-150° C., and the time is 60-120 seconds. The PCB treated with the water-based pore sealing agent of the present invention undergoes the neutral salt spray test, the nitric acid vapor test, the mixed gas test, and the sulfur dioxide and bonding tensile strength test, and the results have indicated that the anti-oxidation and anti-corrosion properties of the coating thereof are significantly enhanced.

19 Claims, 1 Drawing Sheet

AQUEOUS PHASE PORE SEALING AGENT IMROVING PCB COATING OXIDATION-RESISTANT AND CORROSION-RESISTANT PROPERTIES AND METHOD FOR USING SAME

TECHNICAL FIELD

The present invention relates to the field of anti-oxidation and anti-corrosion of electroplated and chemical plated metallic layers, particularly relates to the use of water-based pore sealing technology and its related methods to enhance the anti-oxidation and anti-corrosion properties of PCB (Printed Circuit Board) coatings.

PRIOR ART

Recently, with the rapid development of electronic technology and the appearance of the high-tech electronic industry, new electronic products have been unceasingly introduced aiming at the trends of lightness, thinness, shortness and smallness. Under this trend, PCB, as the carrier for supporting electronic elements and making them electrical connected, has to be highly integrated in order to meet the assembling requirement of the compact installation of different types of components with varied techniques. Therefore, it is required excellent assembly properties of the solder joint and the bonding pad of PCB. PCB is copper-based and is easily subject to oxidation, and such oxidation layer would not only cause higher electrical contact resistance, even insulated, but also make it non-solderable. In order to prevent the copper surface from oxidization, surface coating (plating) layer is coated/plated on the copper substrate of PCB. At present, nickel plating layer is widely used. However, a high-density self-passivating film is easy to be formed on the surface of the nickel layer, with a thickness up to 100 nm. When the thickness of the self-passivating film is beyond 25 nm (~1 μinch), it will cause assembling defects, including the worsening or even fully disappearing of solderability, failure of bonding assembling; meanwhile, the contact resistance of the plating layer will be increased by the self-passivating film, and it will seriously influence the use of PCB. To prevent the oxidization of nickel plating layer, a metallic protecting layer is usually applied on its surface. At present, gold is selected as the protecting layer for nickel due to its excellent conductivity and chemical stability as well as compatibility with nickel in microstructure.

However, limited by the actual technical level of industry, it is impossible to make the surface of the copper substrate of PCB having an ideal smoothness; and impurities in the electroplating/chemical plating solutions are also unavoidable. These two factors will definitely cause crystallographic defects on the plating layer, such as deformed crystallization and micropores on the plating layer, which in turn results in the exposure of the nickel layer. From the aspect of microstructure, the defects of crystallization on the plating layer usually originates at the base plating layer, then it will grow and finally spread to the most outer surface of plating layer from the sites of defects on the substrate; from the aspect of physicochemical properties, these metal crystals on the sites of defects of crystallization have been in the "metastable state" or "active state", and easy to be corroded and then become the starting point of corrosion for the whole PCB. Meanwhile, some amounts of electroplating/chemical plating solutions are easily remained at the sites of defects of crystallization of the plating layer. With the extension of the storage and application time of PCB, the exposed nickel will be corroded into nickel salt, and once local corrosion happened, it would develop into comprehensive corrosion quickly, and the so-called "gold layer oxidization" is formed. The gold layer oxidization would not only cause change of apparent volume and color of the plating layer, but also influence the appearance of the products as well as the assembling and soldering or bonding result, and further cause the conduction failure of functional contact points. When the gold layer oxidation becomes worse, it would cause the break of circuit within the PCB plate, causing huge amount of product scrapped. Especially the residue in the microspores of the plating layer could not be totally removed by conventional water washing, the residue not only cause ordinary chemical corrosion within the plating layer, but also turn the ordinary corrosion into more serious electro-chemical corrosion, which will result in the rapid deterioration of the plating layer.

In order to prevent the oxidization of the PCB plating layer, it is conventional to thicken the gold-plating layer and apply vacuum package to ease the corrosion of PCB, with decreasing the microporosity of the surface of the plating layer and isolating the air. However, thickening the gold-plating layer would increase the difficulty of manufacturing and production cost. What's more, it could not fundamentally eliminate the oxidization of the plating layer due to the defects of crystallization, especially due to the residue at the sites of defects. Although most of air is isolated by vacuum package, there is still problem of oxidization caused by the remained small amount of air, and it does not have the ability to prevent defects of crystallization. More importantly, vacuum package can be used just for the unassembled PCB, but the assembled PCB will certainly be exposed to air, the problem of oxidization and corrosion for the product during using could not be solved by the vacuum package.

At present, a great number of patents relating to the protecting agent of metal anti-oxidation and anti-corrosion have already been disclosed, such as patents with the publication number of 101824621A, 101514457A, 101974758A, 101701337A, wherein compounds such as azoles, imidazoles, thiazoles or thioalcohols and their derivatives thereof are used as the most important functional ingredients to treat metal plating layers, the mechanism of which is through the organic protecting film formed on the surface of the plating layer by the complexation of specific organic functional group(s) of the functional component(s) and metallic elements, so that the corrosive substances in the air, such as oxygen, water vapor, sulfur dioxide, are isolated from contacting with the metal surface, and the purpose of preventing oxidization of the plating layer would be achieved. However, the factors influencing the oxidization and corrosion of the plating layer do not only come from the various oxidative and corrosive substances outside, residue left in the micropores of the plating layers is also a very important factor. Because there exists comparatively big electric potential difference between gold and nickel, gold-nickel layer and the residue in the micropores thus will compose many micro primary batteries and induce serious electrical chemical corrosion.

Within the current patents and technologies of anti-oxidation and anti-corrosion, the oxidization of the plating layer is mainly prevented by the forming of protecting film on the surface of the plating layer. Unfortunately, residue in the micropores on the plating layers, a very important factor of electro-chemical corrosion, has been neglected by many, this actually is the key reason for the appearance of "gold layer oxidization" even if thickening the gold-plated layers and vacuum package are applied in the PCB field.

Meanwhile, neutral salt spray test has been mainly used in those published patents to measure the anti-oxidation and anti-corrosion properties. Neutral salt spray test is a simple conventional method of evaluating and characterizing the anti-oxidation and anti-corrosion properties of electroplating and chemical plating layers; however, due to the complexity of oxidization and corrosion on the plating layer, and the continuously increasing of requirements, from the customers as well as industry of electroplating and PCB, on the quality of products, as a traditionally conventional characterizing way, neutral salt spray test is not sufficient for comprehensively assessing the properties of anti-oxidation and anti-corrosion of plating layer or the ability to enhance the metal's anti-oxidation and anti-corrosion performance of metal protecting agents, thus more and more new ways and methods for evaluating the properties of anti-oxidation and anti-corrosion of electroplating and chemical plating layers have been developed. Besides neutral salt spray test, there are nitric acid vapor test, mixed gas test, sulfur dioxide test and bonding tensile strength test etc. It is required by Nokia, in the year of 2008, as a qualified standard of anti-corrosion of products (EIA-364-53:2000 (R2007), Nitric acid vapor test, Gold Finish Test Procedure For Electrical Connectors And Sockets), all gold-plating connector terminals must be subjected to nitric acid vapor test, the quality of the plating layer, density, homogeneity, porosity of plating layer meeting the requirement of highly reliability of the connector terminals or not, both can be better reflected by the nitric acid vapor test. The anti-oxidation and anti-corrosion properties can be comprehensively understood and evaluated through analysis of the results and data from those testing methods. However, in the present published patents related to the metal anti-oxidation and anti-corrosion, they are basically through the result of neutral salt spray test to demonstrate their ability of anti-oxidation and anti-corrosion, which are obviously insufficient and incomplete.

SUMMARY OF THE INVENTION

Currently, there is no normative uniform technical terms for the chemicals used to prevent the oxidization and corrosion of plating layer both in academic circles and industries, there are numbers of terms used to describe them, such as "protecting agent", "anti-rust agent", "anti-tarnish agent", "passivator", "anti-corrosion agent", and so on. In order to precisely reflect the mechanism of the product of the present invention, "pore sealing agent" is preferably chosen as the title of the product of the present invention, as it is mainly through completely chelating and deep cleaning to eliminate the residues within the micropores in the plating layers; minimizing the reactivity of metal crystallization defects in the micropores to passivate the micropores; and preventing any pollutant outside from entering the micropores to cause corrosion. Meanwhile, as purified water is used as the diluent for the product of the present invention, and the product is completely dissolved in water, thus the more specific title is "water-based pore sealing agent", to differentiate from "oil-based pore sealing agent" in which organic solvents, such as trichloro ethylene, dichloromethane, isoparaffin are used as diluents.

In order to overcome the disadvantages of present art, the present invention provides a water-based pore sealing agent for treating PCB plating layer, by the method of immersing of PCB plating layer, to solve the problem of oxidization of PCB plating layer induced by surface defects of crystallization and residue in micropores.

The water-based pore sealing agent enhancing the anti-oxidation and anti-corrosion properties of PCB plating layer, provided by the present invention, comprises ingredients with the following parts by weight:
corrosion inhibitor 4-12 parts;
surfactants system 15-25 parts;
ion chelating agent 10-20 parts;
pH regulator 6-15 parts; builder 20-40 parts.

The surface tension of said water-based pore sealing agent is in the range of 18-28 dyn/cm.

Besides the ingredients mentioned above, the water-based pore sealing agent may further comprise water, preferably purified water with 5-25 parts.

The corrosion inhibitor used in the water-based pore sealing agent of the present invention is composed of one or more compounds selected from the group consisting of azoles, imidazoles, thiols, thiazoles, long chain aromatic hydrocarbon sulfonic acids and the salt thereof, which are familiar to those skilled in the art of surface treatment, Besides the above mentioned corrosion inhibitors, the formulation of the water-based pore sealing agent of the present invention further comprise 1) mixed surfactants system providing ultra-low surface tension; 2) biosurfactants and builders with significant cleaning ability; 3) ion chelating agents removing the foreign ions in the micropores of the plating layer; and 4) pH regulators providing a weak alkaline environment etc.

The surfactants system used in the present invention is one of the key factors. The surfactants system comprises at least one of fluorinated surfactants or biosurfactants. Wherein the fluorinated surfactant is one or more selected from the group consisting of nonionic surfactants or anionic surfactants; the biosurfactant is one or more selected from the group consisting of rhamnolipids, sophorolipids or polysaccharides, preferably rhamnolipids.

Additionally, the surfactants system can further comprise one or more of nonionic or anionic hydrocarbon surfactants, such as fatty alcohol-polyoxyethylene ether, carboxylate.

The most preferable surfactant is the mixed surfactants system comprising hydrocarbon surfactant, biosurfactant and fluorinated surfactant.

The surface tension of the water-based pore sealing agent comprising the mixed surfactants system of the present invention is within the range of 18~28 dyn/cm. After numbers of experiments, the surface tension is crucial to achieve excellent pore sealing effect of the present invention. The complicated residues contained in the micropores of the plating layers come from various sources, including varied metal salts used during the process of electroplating (metal ions and acid radicals), impurities of metallic ion compounds generated during the process of electroplating, varied organic additives that must be used in the electroplating solutions, and varied small molecule organic compounds generated by the additives during the process of electroplating. There are three key factors of formation of electrochemical corrosion, i.e. inert metal, active metal and electrolyte; the complicated residues have played the role of electrolytes. Due to the pore diameter of the micropores of the plating layer is very small, below 100 nm normally, if only depending on conventional hydrocarbon surfactant, it is impossible to allow the active ingredients, such as chelating agents, builders and biosurfactants, to enter into the micropores and then removing all residues off. After the exploration of huge amounts of experiments of the present invention, when the surface tension of the water-based pore sealing agent is in the range of 18~28 dyn/cm, the working solution of pore sealing agent possesses excellent penetrating and wetting properties. Thus it can enter into the micropores and remove all residues in the micropores successfully without influencing the corrosion inhibitor function, so that a long time protection effect of corrosion inhibition can be obtained for the plating layer. When the surface tension of the pore sealing agent is out this range, the results of salt spray test show that the time consumed for the beginning of corrosion of the product is shortened more than a half in comparison with the present invention.

The pore sealing agent should be diluted (by 10-100 times) to become working solution before use. In order to play the actual function during using, the concentration of the surfactants in the working solution must exceed the critical micelle concentration (CMC). When the concentration of surfactants reaches CMC, if the amount of the surfactant is further increased, there is no any change of the surface tension, therefore, the range of the surface tension of the pore sealing agent of the present invention and its working solution thereof is the same, i.e. in the range of 18~28 dyn/cm, during which great penetration effect and protecting effect of surface corrosion inhibition for the plating layer can always be maintained under diluting of high times for the pore sealing agent of the present invention.

After further exploration, the present invention provides series of surfactants systems suitable for the purpose of the invention and its amount of usage in the water-based pore sealing agent is also confirmed. On the basis of the conventional hydrocarbon surfactants, the surface tension of the whole pore sealing agent working solution can be significantly decreased by the addition of fluorinated surfactants, therefore, ensuring ingredients of the pore sealing agent such as chelating agents, builders and biosurfactants deeply penetrate and enter into the inner of the micropores, the remained metal ions thereof are captured by the chelating agents, the remained acid radicals and organics are removed effectively by the biosurfactants and builders, and factors causing electrochemical corrosion are eliminated. The surface tension of the whole pore sealing agent working solution can be controlled below 28 dyn/cm or even lower by the fluorinated surfactants; the biosurfactants are metabolites having excellent surface activity excreted during the metabolic process of the microorganisms. Compared with synthetic surfactants, such as hydrocarbon surfactants, the biosurfactants have the unique properties of more complex configuration, more active functional groups, biodegradability, and superior cleaning property for the remained organics in the micropores.

The ion chelating agents used in the present invention for removing foreign ions in the micropores of the plating layer are alcohol amines, preferably diethanolamine, triethanolamine.

The pH regulator used in the water-based pore sealing agent of the present invention is composed of reaction products from saponification of alcohol amines (preferably diethanolamine or triethanolamine) with organic acid; said organic acid is preferably selected from oleic acid, linoleic acid or oleoyl sarcosine; wherein the diethanolamine or triethanolamine is 2~5 parts by weight, the organic acid is 4~10 parts by weight, the pH of the water-based pore sealing agent is 7~11, preferably 7.5~9.5.

The builders used in the water-based pore sealing agent of the present invention is heterocyclic alcohol, alcohol ether or mixtures thereof; the heterocyclic alcohol is preferably tetrahydrofurfuryl alcohol; alcohol ether is preferably ethylene glycol monobutyl ether, ethylene glycol dibutyl ether, propylene glycol monobutyl ether or propylene glycol dibutyl ether etc.

The present invention is also providing a method of using the water-based pore sealing agent: using simple immersing technology to treat and passivate the gold-plating layer of PCB plate with water-based pore sealing agent, characterized in that the electroplated PCB plate is washed and then immersed in the above mentioned water-based pore sealing agent working solution, and treated in certain conditions of concentration, temperature and time, then taken out to rinse and dry.

In particular, the water-based pore sealing agent (surface tension is 18~28 dyn/cm) is diluted 10~100 times (in vol.), preferably 100/8~100/3 times, by purified water firstly; pH is 7~11, preferably 7.5~9.5. The electroplated PCB plate, after being washed, is treated by immersing in the working solution of the water-based pore sealing agent, with temperature of 20~60° C., 60~150 seconds, then the pore sealed PCB plate is taken out for rinsing and drying, the temperature of drying is 80~150° C., with a period of 60~120 seconds.

The preferable method of using the water-based pore sealing agent in the present invention is the incorporation of ultrasonic-assisted cleaning technology during the process of pore sealing treatment of the PCB plate (during the process of immersing specifically). The mechanism of ultrasonic washing is that the vibration signals with a frequency of over 20 KHz is power amplified by a ultrasonic generator and then converted into high frequency mechanical vibration energy under the inverse piezoelectric effect of a ultrasonic energy converter (vibration head) to allow vibration of molecules of the cleaning solution and to generate countless tiny bubbles by the sound radiation in the cleaning medium. The bubbles are formed and grow in the section of negative pressure along the direction of transmission of ultrasonic wave, and rapidly shrunk in the section of positive pressure thus instantaneous high pressure (thousands of atmospheres) generated and blasted, generating countless high pressure micro-shock wave applied on the surface of the cleaned work pieces, this is namely "cavitation" of ultrasonic cleaning. Therefore, ultrasonic cleaning achieve outstanding cleaning ability for the work piece with the characteristics of complex structure both inside and outside, microcosmic uneven surface, crevices, small pores, corners, dead angles, intensive elements, which is incomparable with other cleaning method. As the result of cleaning of residue in the micropores of the plating layer by the water-based pore sealing agent will be directly infected by the cleaning effect, ultrasonic-assisted cleaning is preferably used to enhance the cleaning effectiveness, when the work piece is treated with pore sealing agent. By ultrasonic-assisted cleaning, the efficiency of mixed surfactants can be further increased, that means ensuring an easier access to the micropores of the plating layer for the active ingredients of the pore sealing agent such as chelating agents, builders, biosurfactants, and then sufficiently removing of various kinds of residues in the micropores.

The removal of the residues by the chelating agents and the surfactants and formation of film of the corrosion inhibitors can be achieved in one step by the water-based pore sealing agent system and method thereof provided by the present invention.

Meanwhile, in order to comprehensively characterize the effect of enhanced anti-oxidation and anti-corrosion properties of the water-based pore sealing agent provided by the present invention for the metallic plating layer, a series of accelerated corrosion tests are performed, including neutral salt spray test, nitric acid vapor test, mixed gas test, sulfur dioxide test and bonding tensile strength test, to evaluate the protection property for the metallic plating layer comprehensively.

The advantages of the present invention lie in:

1) Fundamentally solve the problem of oxidization and corrosion of the PCB plating layer caused by defects of crystallization and residues in micropores. It has shown excellent properties of anti-tarnish, anti-corrosion and anti-oxidation, in neutral salt spray test, nitric acid vapor test, mixed gas test and sulfur dioxide test.

2) To the PCB product without treatment of pore sealing agent protection, the oxidization of the surface of the plating layer will lead to the widespread presence of the passivated layer, even corrosion layer will appear apparently in most cases, and both of them would lead to the failure of soldering or bonding assembling, even to be scrapped. After the protective treatment with the water-based pore sealing agent of the present invention, the bonding tensile strength test has demonstrated that the qualification rate of the product increases significantly.

3) Currently, oxidization, corrosion and discoloration on the PCB products without protective pore sealing treatment of plated layer have occurred frequently, that has caused large amounts of disqualified product before the assembling, the rate of disqualified product could reach up to 40~50%. For PCB products with protective treatment of the water-based pore sealing agent of the present invention, there is substantially without any of plate surface oxidization, corrosion and discoloration, the qualification rate of the product increases significantly.

4) Even for those "qualified" PCB products, when assembled, many of which still have to be repaired even scrapped during use, due to the bad conduction or invalidation caused by oxidization and corrosion formed on the plated layer without protection, it is a enormous waste of manpower and material resources. After treated with the water-based pore sealing agent of the present invention, the long-term reliability of the conductive property of the plated layer has been increased greatly.

Although the water-based pore sealing agent of the present invention is mainly used to enhance the anti-oxidation and anti-corrosion properties of the gold-plating layer of the PCB plate, it can be predicated rationally with the mechanism of the water-based pore sealing agent, under the condition of maintaining the mixed surfactants system, chelating agents and builders disclosed in the present invention unchanged, the protection of other metallic plating layers, such as silver, copper, tin, nickel, can also be achieved by the varied selection of different corrosion inhibitors, effectively prevent them from oxidization and corrosion.

DETAILED DESCRIPTION OF THE PREFERRED EMBODIMENTS

Figure 1:
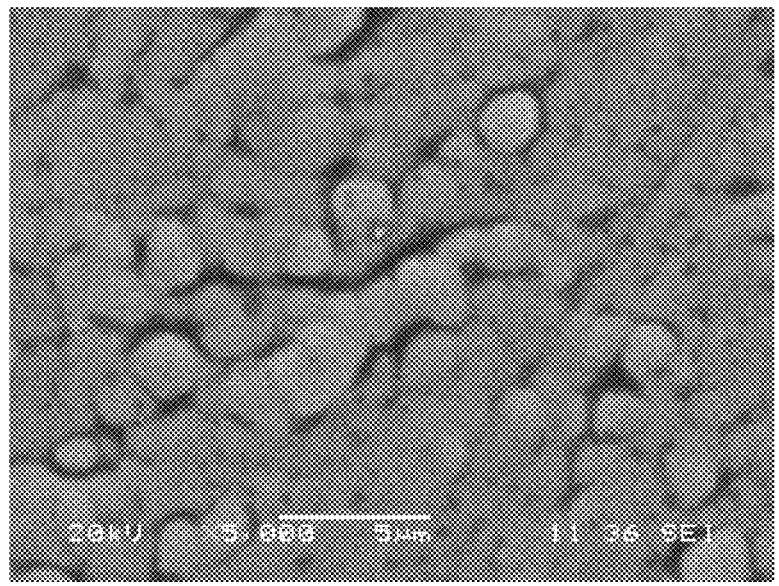
FIG. 1 is the scanning electron microscope (SEM) photograph of PCB plate before pore sealing treatment.

In order to explain the technical content of the present invention more clearly, the following detailed examples are provided, however, the embodiment of the present invention is not limited thereto.

Example 1

Comparison of Resistance of Salt Spray for Different Surfactant Systems

Formulation of the concentrated solution of the water-based pore sealing agent of this example is as follows, by weight:

1-phenyl-5-thiol-tetrazole 1%, and
5-(4-tert-butylphenyl)-1H-1,2,4-triazole-3-thiol 3%,
surfactants system (for details referred to table 1) in total 25%,
diethanolamine 12%, triethanolamine 5%, oleic acid 2% and linoleic acid 2%,
tetrahydrofurfuryl alcohol 14%, ethylene glycol dibutyl ether 14% and propylene glycol dibutyl ether 12%, and
purified water the rest.

The above concentrated solution is diluted, with the ratio of 30 ml/L, by purified water, and resulted diluent is the working solution of the water-based pore sealing agent.

Sample of work piece tested: general type of copper material, ordinary electroplating process, a nickel based plating layer with thickness 1.0~1.5 μm (40~60μ), a gold plated layer with thickness over 0.05 μm (2μ), the quality of crystallization of the plating layer belongs to the ordinary level, the number of crystallographic defects and micropores on the plating layer is within the range of ordinary requirement in the art.

Conditions of pore sealing treatment: Pore sealing temperature 60° C., pore sealing time 120 seconds; after pore sealing, rinsing work piece; and then drying them at 100° C. for 100 seconds.

After pore sealing treatment, the test work piece samples are subjected to neutral salt spray test, according to method provided by the standard of GB/T 10125-1997. The property of anti-corrosion is evaluated by inspecting the time needed for the beginning of corrosion during the process of testing work piece samples, the longer the time needed, the stronger anti-corrosion. The results are listed in table 1:

TABLE 1

Comparison of the property of salt spray resistance for different surfactants systems

| Surfactants systems | Type of surfactants system | *surface tension of the working solution (dyn/cm) | **time needed for the beginning of corrosion on the product (hours) |
|---|---|---|---|
| fatty alcohol-polyoxyethylene ether:alcohol ether carboxylate (20:5) | Hydrocarbon surfactants | 34 | 36 |
| rhamnolipid:alcohol ether carboxylate (20:5) | Biosurfactants | 25 | 72 |
| fluorinated surfactant:alcohol ether carboxylate (20:5) | Fluorinated surfactants | 19 | 60 |
| fatty alcohol-polyoxyethylene ether:rhamnolipid:fluorinated surfactant:alcohol ether carboxylate (2:15:3:5) | Mixed surfactants | 20 | 96 |

*the surface tension of all examples are measured by the surface tension tester SEO Phoenix 450, with the method of pendant drop.
**observing every 12 hours Wherein the fatty alcohol-polyoxyethylene ether is Tergitol 15-S-9 available by DOW Chemical Company, the alcohol ether carboxylate is AEC-9Na (28) available by Shanghai Fine Chemical Co., Ltd, the rhamnolipid is JBR215 available by Jeneil Biosurfactant Co., the fluorinated surfactant is Zonyl® FSH available by Du Pont.

It can obviously find from table 1, when the fatty alcohol-polyoxyethylene ether of the hydrocarbon surfactants system is replaced by the biosurfactant rhamnolipid or the fluorinated surfactant Zonyl® FSH, the surface tension of the whole working solution is significantly decreased, the surface tension of working solution containing the fluorinated surfactant is the lowest; meanwhile, the capability of anti-corrosion of the product subjected to pore sealing treatment with latter is significantly better than that of the product treated with the pore sealing agent containing hydrocarbon surfactants system only, wherein, the ability of anti-corrosion of sample treated with the working solution containing biosurfactant is the best, that of sample treated with the working solution containing fluorinated surfactant is in the second place, which indicates that within certain range of surface tension, the capability of cleaning of the biosurfactant could increase the property of anti-oxidation of PCB plate significantly. It is also demonstrated that in the water-based pore sealing agent of the present invention, the main function of the fluorinated surfactant is to decrease the surface tension, and the main function of the biosurfactant is to remove the residues in the micropores of the plating layer. A mixed surfactants system comprising hydrocarbon surfactants, biosurfactants and fluorinated surfactants together have the best property of anti-corrosion.

Example 2

Influence of Ultrasonic on Function of the Water-Based Pore Sealing Agent

In this example, the formulation of concentrated solution of the pore sealing agent, concentration of the diluents (working solution) and samples of tested work piece are the same as those of example 1, and the mixed surfactants system in table 1 is selected (fatty alcohol-polyoxyethylene ether+rhamnolipid+fluorinated surfactant+alcohol ether carboxylate), the enhancing effect of ultrasonic-assist cleaning for the pore sealing agent under the same other testing conditions, with or without ultrasonic-assist cleaning, is tested.

TABLE 2

Influence of ultrasonic-assisted cleaning on the pore sealing agent performance

| Mixed surfactants system | Pore sealing treatment conditions | Whether ultrasonic-assisted cleaning or not | *time needed for the beginning of corrosion on the product (hours) |
|---|---|---|---|
| fatty alcohol-polyoxyethylene ether:rhamnolipid:fluorinated surfactant:alcohol ether carboxylate (2:15:3:5) | Pore sealing temperature 60° C., pore sealing time 120 seconds, then taken out to rinse, hot air drying 100° C., 100 seconds | No<br>Yes | 96<br>132 |

*observing every 12 hours

The data in table 2 has demonstrated clearly: for the same water-based pore sealing agent, samples of the work piece tested are treated under the same conditions, the property of anti-corrosion of the tested samples can be further improved greatly after the incorporation of ultrasonic-assisted cleaning. It attributes to the improved cleaning effect of water-based pore sealing agent to remove the residues in the micropores of the plating layer, promoted by the ultrasonic assistance. This indicates the cleaning effect of the micropores of the plating layer, will be significantly influenced by the cleaning ingredients, such as surfactants, builders etc, of the water-based pore sealing agent of the present invention: a deeper cleaning will cause a more effective pore sealing result and subsequently further enhancing the anti-oxidation and anti-corrosion properties of plating layer.

Example 3

Nitric Acid Vapor Test of PCB Gold Fingers

Formulation of the concentrated solution of the pore sealing agent of this example is as follows, by weight:

1-phenyl-5-thiol-tetrazole 2% and 2-mercaptobenzimidazole 6% rhamnolipid (JBR215)12%, fluorinated surfactant (Zonyl® FSH) 3% and coconut diethanolamide phosphate, i.e. detergent 6503 widely used in the industry, 3%.

diethanolamine 17%, triethanolamine 8%, linoleic acid 6% and oleoyl sarcosine 4%, tetrahydrofurfuryl alcohol 13% and propylene glycol monobutyl ether 12%, purified water the rest.

The surface tension of the pore sealing agent is 21 dyn/cm.

The above concentrated solution is diluted, with the ratio of 50 ml/L, by purified water, and resulted diluent is the working solution of the water-based pore sealing agent.

Conditions of pore sealing treatment: Pore sealing temperature 40° C., pore sealing time 90 seconds; after pore sealing, rinsing work piece; and then drying them at 150° C. for 60 seconds.

A group of gold fingers are washed, and then immersed in the water-based pore sealing agent working solution for pore sealing treatment; another group of gold fingers as the control, without pore sealing treatment.

The nitric acid vapor test is carried out for both gold fingers treated and control group untreated. The test cycle is 1 hour, according to method provided by the standard of GB/T 19351-2003; the test result is evaluated by the number and sizes of corrosion points. Results of nitric acid vapor test are listed in table 3.

TABLE 3

Comparison of nitric acid vapor test results

| Description of the samples | Number of corrosion points smaller than 7.5 μm (number/cm$^2$) | Number of corrosion points larger than 7.5 μm (number/cm$^2$) |
|---|---|---|
| without pore sealing treatment | 19 | 6 |
| with pore sealing treatment | 0 | 0 |

Figure 2:
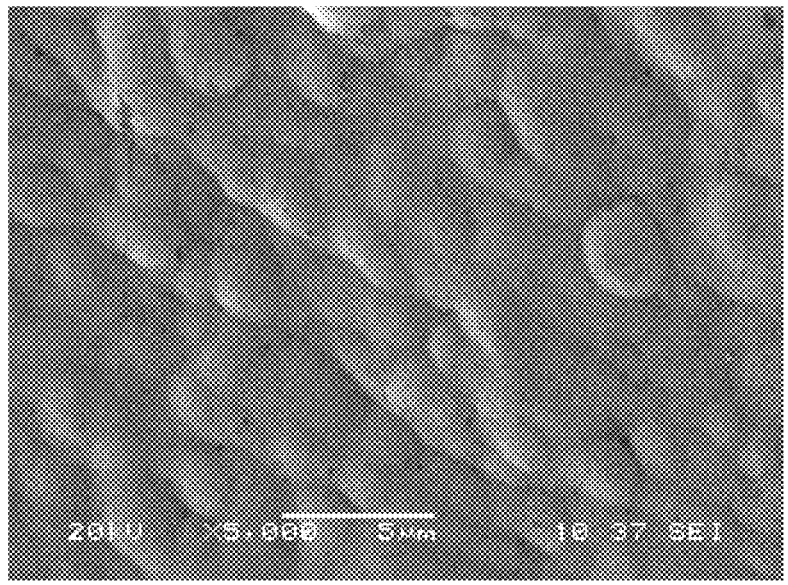
FIG. 2 is the SEM photograph of PCB plate after pore sealing treatment.

Meanwhile, through SEM characterization of the gold fingers, it can be observed that the defects of crystallization is serious in those gold plated layer of the gold fingers without pore sealing treatment, many gaps and visible cracks are presented (FIG. 1), and the lattices of the gold plated layers with pore sealing treatment are compact and homogeneous (FIG. 2), which has demonstrated the great repair effect of the pore sealing agent for the defects of crystallization.

Example 4

Neutral Salt Spray Test of the Flexible Printed Circuit Board (FPC)

Formulation of the concentrated solution of the pore sealing agent of this example is as follows, by weight:
1-phenyl-5-thiol-tetrazole 1% and
5-(4-tert-butylphenyl)-1H-1,2,4-triazole-3-thiol 3%,
rhamnolipid (JBR215) 6%, fluorinated surfactant (DuPont, Zonyl® 1033D) 3%, polyether (DOW Chemical, Triton CF-76)12% and alcohol ether carboxylate A (EC-9Na (28))$_4$%,
diethanolamine 12%, triethanolamine 5%, oleic acid 2% and linoleic acid 2%,
tetrahydrofurfuryl alcohol 14%, ethylene glycol dibutyl ether 13%, and propylene glycol dibutyl ether 13%,
purified water the rest.

The surface tension of the pore sealing agent is 27 dyn/cm.

The above concentrated solution is diluted, with the ratio of 30 ml/L, by purified water, and resulted diluent is the working solution of the water-based pore sealing agent.

Conditions of pore sealing treatment: Pore sealing temperature 60° C., pore sealing time 150 seconds; after pore sealing, rinsing work piece; and then drying them at 100° C. for 100 seconds.

A group of FPC plated with gold coating, treated with the pore sealing agent, and another group of FPC plated with gold coating as the control, without pore sealing agent treatment.

The neutral salt spray test is carried out for both FPC treated and control group untreated The test cycle is 48 hours, according to method provided by the standard of GB/T 10125-1997; the test result is evaluated according to rating standard of GB/T6461-2002.

The plating layer of the FPC without pore sealing treatment are corroded in large area and cracks appear after 48 h of salt spray test, there is no visible imperfection of corrosion on the FPC with pore sealing treatment. The rating of the appearance and the damage of the cover layer are listed in table 4.

TABLE 4

Comparison of the neutral salt spray test results

| Sample description | Appearance rating | Damage coating rating |
|---|---|---|
| without pore sealing treatment | Level 1 | Level H |
| with pore sealing treatment | Level 10 | Level A |

Example 5

Mixed Gas Test of the Gold Fingers

Formulation of the concentrated solution of the pore sealing agent of this example is as follows, by weight:
1-phenyl-5-thiol-tetrazole 2%, 2-mercaptobenzimidazole 5% and
2,5-dimercapto-1,3,4-thiadiazole 5%;
rhamnolipid (JBR215) 7%, fluorinated surfactant (DuPont, Zonyl® FSH) 4%,
alkyl polyglucoside (Shanghai Fine Chemical Co., Ltd APG 0810) 3% and alcohol ether carboxylate (AEC-9Na (28))1%,
diethanolamine 14%, triethanolamine 5%, oleic acid 3% and oleoyl sarcosine 4%,
tetrahydrofurfuryl alcohol 6% ethylene glycol monobutyl ether 7% and propylene glycol monobutyl ether 7%,
purified water the rest.

The surface tension of the pore sealing agent is 20 dyn/cm.

The above concentrated solution is diluted, with the ratio of 80 ml/L, by purified water, and resulted diluent is the working solution of the water-based pore sealing agent.

Conditions of pore sealing treatment: Pore sealing treatment at room temperature, pore sealing time 60 seconds; after pore sealing, rinsing work piece; and then drying them at 110° C. for 80 seconds.

A group gold fingers treated with pore sealing agent; another group of gold fingers as the control, without pore sealing treatment.

The mixed gas test is carried out for both gold fingers treated and control group untreated. The test cycle is 10 days, according to method provided by the standard of GR-1217-CORE; the test result is evaluated by the micro resistance of the gold fingers.

After the mixed gas test, the gold plating layer of the gold fingers without pore sealing treatment is severely peeled, while there is no obvious changing on surface of the gold layer with pore sealing treatment. The measured data of micro resistance are listed in table 5, the result has shown that after the mixed gas test with the cycle of 10 days, the micro resistance of the gold fingers without pore sealing treatment is greater than 1Ω, which is severely corroded and disconnected; the property of anti-corrosion of the gold fingers with pore sealing treatment is improved, and the value of micro resistance is in the magnitude of mΩ, and without significant difference with that of before test, and in a good conductivity. It is demonstrated that the plating layer of the gold fingers has achieved great property of anti-corrosion by the pore sealing treatment, that is able to provide long-term guarantee for its good conductivity, ensuring the long-term reliability of the final product.

TABLE 5

Comparison of the mixed gas test results

| Sample description | Micro resistance before the test (mΩ) | | | | | Micro resistance after the test (mΩ) | | | | |
|---|---|---|---|---|---|---|---|---|---|---|
| without pore sealing treatment | 4.64 | 4.79 | 4.44 | 4.61 | 5.59 | >1Ω | >1Ω | >1Ω | >1Ω | >1Ω |
| | 5.70 | 4.20 | 5.27 | 5.19 | 4.51 | >1Ω | >1Ω | >1Ω | >1Ω | >1Ω |

TABLE 5-continued

Comparison of the mixed gas test results

| Sample description | Micro resistance before the test (mΩ) | | | | | Micro resistance after the test (mΩ) | | | | |
|---|---|---|---|---|---|---|---|---|---|---|
| with pore sealing treatment | 9.78 | 9.99 | 9.43 | N.A. | 9.45 | >1Ω | >1Ω | >1Ω | N.A. | >1Ω |
| | 8.87 | 9.34 | 9.58 | 9.64 | 9.56 | >1Ω | >1Ω | >1Ω | >1Ω | >1Ω |
| | 6.10 | 5.21 | 4.13 | 3.82 | 4.63 | 13.87 | 4.69 | 7.56 | 5.63 | 3.85 |
| | 5.80 | 5.79 | 4.60 | 4.98 | 4.33 | 6.72 | 5.06 | 5.51 | 9.35 | 9.80 |
| | 10.54 | 10.46 | 9.91 | N.A. | 11.35 | 18.50 | 12.12 | 13.25 | N.A. | 9.14 |
| | 8.48 | 8.93 | 9.16 | 9.91 | 9.82 | 13.68 | 9.71 | 10.42 | 15.67 | 9.99 |

Example 6

Saturated Sulfur Dioxide Test of Gold Fingers

Formulation of the concentrated solution of the pore sealing agent of this example is as follows, by weight:

2-mercaptobenzoxazole 2%, 2,5-dimercapto-1,3,4-thiadiazole 2% and octadecanethiol 3% rhamnolipid (JBR215) 5%, fluorinated surfactant (Zonyl® 1033D) 3% and fatty alcohol-polyoxyethylene ether (Tergitol 15-S-9) 12% diethanolamine 10%, triethanolamine 5%, oleic acid 4% and oleoyl sarcosine 4%, tetrahydrofurfuryl alcohol 15% and ethylene glycol monobutyl ether 15% purified water the rest.

The surface tension of the pore sealing agent is 24 dyn/cm.

The above concentrated solution is diluted, with the ratio of 40 ml/L, by purified water, and resulted diluent is the working solution of the water-based pore sealing agent.

Conditions of pore sealing treatment: Pore sealing temperature 50° C., pore sealing time 100 seconds; after pore sealing, rinsing work piece; and then drying them at 80° C. for 120 seconds.

A group of gold fingers are subjected to pore sealing; another group of gold fingers as the control, without pore sealing treatment.

The saturated sulfur dioxide test is carried out with the gold fingers treated and the control group untreated. The test cycle is 24 hours, based on the standard GB/T2423.33-2005, using saturated sulfur dioxide in the test. The test result is evaluated by the first appearance after test and the corrosion area of coating after removing the corrosion products.

In the sulfur dioxide test, the gold fingers with pore sealing treatment demonstrate strong property of anti-corrosion, and results are listed in table 6.

TABLE 6

Comparison of the saturated sulfur dioxide test results

| Sample description | First appearance | The corrosion area of the plating layer after the removing of the corrosion products |
|---|---|---|
| without pore sealing treatment | the plating layer is severely covered by corrosion products | over 95% plating layer is corroded |
| with pore sealing treatment | no any corrosion on the plating layer | no any corrosion on the plating layer |

Example 7

Bonding (Assembling) Tensile Strength Test of Gold Plating Board

In this example, the formulation of concentrated solution of the pore sealing agent, concentration of the diluents (working solution) and samples of tested work piece are totally the same as those of example 6.

Wholly gold-plating board is selected for the bonding test, with the thickness of gold of 0.25 micrometers, the tensile strength is tested after the bonding of aluminum wire, 9 testing points are selected for each bonding test board, according to the enterprise standard, qualified tensile strength of the aluminum wire bonding test is larger than 8 g, the results are listed in table 7:

TABLE 7

Comparison of the bonding tensile strength test results

| Test condition | Boards without pore sealing treatment | Boards with pore sealing treatment |
|---|---|---|
| Bonding tension before salt spray test (g) | 9~14 | 10~16 |
| Bonding tension test after 2 hours of salt spray (g) | 8~12 | 9~15 |
| Bonding tension test after 12 hours of salt spray (g) | all solder joints are exfoliated, tension smaller than 6 | 9~15 |

Above mentioned accelerated corrosion tests under varied harsh conditions have proven that, the defects of crystallization on the plating layer of the PCB with protective treatment of the water-based pore sealing agent of the present invention are significantly repaired, the gold layer is structurally compact; the abilities of anti-oxidation, anti-corrosion against the harsh environment are significantly improved.

At the same time, though the water-based pore sealing agent of the present invention is mainly used to improve the anti-oxidation and anti-corrosion properties of the gold-plated layer of the PCB plate, it can be predicated rationally with the mechanism of the water-based pore sealing agent, under the condition of maintaining the mixed surfactants system, chelating agents and builders disclosed in the present invention unchanged, the protection of other metallic plating layers, such as silver, copper, tin, nickel, can also be achieved by the varied selection of different corrosion inhibitors, effectively prevent them from oxidization and corrosion.

What is claimed is:

1. A water-based pore sealing agent enhancing anti-oxidation and anti-corrosion properties of metals, comprises the ingredients with the following parts by weight:

corrosion inhibitor 4-12 parts;
surfactants system 15-25 parts;
ion chelating agent 10-20 parts;
pH regulator 6-15 parts;
builder 20-40 parts;
the surface tension of said water-based pore sealing agent is within the range of 18-28 dyn/cm.

2. The water-based pore sealing agent of claim 1, wherein said surfactants system comprises at least one of fluorinated surfactants or biosurfactants.

3. The water-based pore sealing agent of claim 2, wherein fluorinated surfactants of said surfactants system is one or more surfactant(s) selected from the group consisting of nonionic surfactants and anionic surfactants.

4. The water-based pore sealing agent of claim 3, wherein said surfactants system further comprises one or more hydrocarbon surfactant(s), and said biosurfactant is rhamnolipid.

5. The water-based pore sealing agent of claim 1, wherein said corrosion inhibitor is composed of one or more compounds selected from the group consisting of azoles, imidazoles, thiols, thiazoles, and long chain aromatic hydrocarbon sulfonic acids, and the salt thereof.

6. The water-based pore sealing agent of claim 1, wherein said water-based pore sealing agent further comprises 5-25 parts of water.

7. The water-based pore sealing agent of claim 2, wherein the biosurfactants is one or more surfactant(s) selected from the group consisting of rhamnolipid, sophorolipids and polysaccharide.

8. The water-based pore sealing agent of claim 1, wherein said ion chelating agent is alcohol amines.

9. The water-based pore sealing agent of claim 8, wherein said alcohol amines are diethanolamine or triethanolamine.

10. The water-based pore sealing agent of claim 1, wherein said pH regulator is composed of reaction products from saponification of alcohol amines and organic acids.

11. The water-based pore sealing agent of claim 1, wherein said builder is a heterocyclic alcohol or an alcohol ether or mixtures thereof.

12. The water-based pore sealing agent of claim 1, wherein the pH of said water-based pore sealing agent is 7-11.

13. The water-based pore sealing agent of claim 10, wherein said organic acids are oleic acid, linoleic acid or oleoyl sarcosine.

14. The water-based pore sealing agent of claim 11, wherein said heterocyclic alcohol is tetrahydrofurfuryl alcohol.

15. The water-based pore sealing agent of claim 11, wherein said alcohol ether is ethylene glycol monobutyl ether, ethylene glycol dibutyl ether, propylene glycol monobutyl ether or propylene glycol dibutyl ether.

16. The water-based pore sealing agent of claim 5, wherein the pH of said water-based pore sealing agent is 7.5-9.5.

17. A method for enhancing the anti-oxidation and anti-corrosion properties of PCB plating layer, wherein the water-based pore sealing agent of claim 1 is diluted 10~100 times by volume with purified water to form diluent, the PCB plating layer is washed and then immersed in the diluent of the water-based pore sealing agent for pore sealing treatment for 60-150 seconds at 20-60° C., and then taken out to rinse and dry.

18. The method for enhancing the anti-oxidation and anti-corrosion properties of PCB plating layer of claim 17, wherein the water-based pore sealing agent is diluted 100/8~100/3 times by purified water to form diluent; the PCB plating layer is welded, immersed in the diluent of the water-based pore sealing agent, and then dried for 60-120 seconds at 80-150° C.

19. The method for enhancing the anti-oxidation and anti-corrosion properties of PCB plating layer of claim 17, wherein while the PCB plating layer is immersed in the diluent, an ultrasonic wave is applied to the diluent.

* * * * *